United States Patent [19]

Ichikawa

[11] Patent Number: 5,003,375

[45] Date of Patent: Mar. 26, 1991

[54] MIS TYPE SEMICONDUCTOR INTEGRATED CIRCUIT DEVICE HAVING A REFRACTORY METAL GATE ELECTRODE AND REFRACTORY METAL SILICIDE FILM COVERING THE GATE ELECTRODE

[75] Inventor: Matsuo Ichikawa, Suwa, Japan

[73] Assignee: Seiko Epson Corporation, Tokyo, Japan

[21] Appl. No.: 560,006

[22] Filed: Jul. 27, 1990

Related U.S. Application Data

[63] Continuation of Ser. No. 299,471, Jan. 18, 1989, abandoned.

[30] Foreign Application Priority Data

Jan. 21, 1988 [JP] Japan .................................. 63-11463
Jan. 21, 1988 [JP] Japan .................................. 63-11464
Sep. 7, 1988 [JP] Japan .................................. 63-223720

[51] Int. Cl.⁵ ...................... H01L 27/01; H01L 29/04; H01L 23/48; H01L 29/46
[52] U.S. Cl. .................................. 357/71; 357/23.1; 357/59; 357/67; 437/200
[58] Field of Search ..................... 357/67, 71, 59, 23.1, 357/23.3, 23.9; 437/200

[56] References Cited

U.S. PATENT DOCUMENTS

| | | | |
|---|---|---|---|
| 4,141,022 | 2/1979 | Segg et al. | 357/71 |
| 4,227,944 | 10/1980 | Brown et al. | 357/71 |
| 4,274,106 | 6/1981 | Ohdate | 357/81 |
| 4,329,706 | 5/1982 | Crowder et al. | 357/23.9 |
| 4,774,204 | 9/1988 | Havemann | 437/200 |
| 4,807,013 | 2/1989 | Manoaha | 357/59 |
| 4,866,492 | 9/1989 | Quigg | 357/71 |
| 4,924,281 | 3/1990 | Endo et al. | 357/71 |

FOREIGN PATENT DOCUMENTS

| | | | |
|---|---|---|---|
| 56-50533 | 8/1981 | Japan | 357/67 |
| 62-86865 | 4/1987 | Japan | 357/71 |

OTHER PUBLICATIONS

S. M., Sze, *Semiconductor Devices, Physics and Technology*, John Wiley & Sons (1985), p. 382.

Primary Examiner—J. Carroll
Attorney, Agent, or Firm—Spensley, Horn, Jubas & Lubitz

[57] ABSTRACT

An MIS type semiconductor integrated circuit device, composed of: a semiconductor substrate of a first conductivity type provided with spaced source and drain regions of a second conductivity type; a gate insulated film formed on the semiconductor substrate; a film of polycrystalline silicon formed on the gate insulation film; a gate electrode composed of a film of a refractory metal formed on the polycrystalline silicon film; and a film of a refractory metal silicide formed on the exposed surfaces of the gate electrode; wherein the source and drain regions are formed in the semiconductor substrate on both sides of the gate electrode on which the refractory metal silicide film is formed.

23 Claims, 2 Drawing Sheets

MIS TYPE SEMICONDUCTOR INTEGRATED CIRCUIT DEVICE HAVING A REFRACTORY METAL GATE ELECTRODE AND REFRACTORY METAL SILICIDE FILM COVERING THE GATE ELECTRODE

This is a continuation of application Ser. No. 07/299,471 filed on 1/18/89, now abandoned.

BACKGROUND OF THE INVENTION

The present invention relates to an MIS type semiconductor integrated circuit device with a refractory metal gate electrode.

Devices of this general type are already known in the art. A conventional method for fabricating such a device will be described below with reference to FIG. 1 which shows, in cross section, an MIS device composed of an N-type monocrystalline silicon substrate 11 in which are formed P+ diffusion zones 15, a field insulation film 12, a gate insulation film 13, a refractory metal film gate electrode 14, an interlayer insulation film 16 and aluminum contact members 17. Zones 15 constitute a source region and a drain region In the structure shown above, refractory metal film gate electrode 14 is easily polluted by the resist film and an organic solvent after the electrode is formed, thereby causing variations in, and instability of, the threshold voltage. At the same time, the electrode is weak due to having been chemically treated with acid. Further, the refractory metal film electrode is easily polluted and oxidized if oxygen and moisture are present in the atmosphere of the heat-treatment.

A solution to the above-described problems is suggested in Japan Laid-Open Patent No. 58-46651, which discloses forming a silicon layer with an oxidized surface or a refractory metal silicide layer with an oxidized surface on the side and the top surface of the refractory metal film gate electrode.

In an MIS type semiconductor integrated circuit device as fabricated in accordance with the conventional technique described with reference to FIG. 1, the device has a refractory metal film forming the gate electrode and, therefore, the device is easily polluted by a resist film and an organic solvent, subject to damage due to chemical treatment using acid and so on, and easily oxidized if oxygen and moisture are present in the heat treatment atmosphere. Thus, the conventional MIS type semiconductor integrated circuit device is very inferior from the standpoint of reliability and yield.

The MIS type semiconductor integrated circuit device disclosed in Japan Laid-Open Patent No. 58-46651 has a little better characteristics than that having the structure shown in FIG. 1. However, it, too, has problems. This MIS type semiconductor integrated circuit device employs a refractory metal film gate electrode having a resistance which is more than two orders of magnitude, i.e., $10^2$, lower than a polycrystalline silicon layer as a gate electrode. Therefore, the breakdown voltage of the gate is made lower, having high potentiality causing breakdown of the gate insulation film and leakage of electric current or a short circuit between the gate electrode and the semiconductor substrate. The leakage of electric current and the short circuit caused between the gate electrode and the semiconductor substrate are considered to be due to the metal from the refractory metal film reaching the substrate and penetrating through the gate insulation film, refractory metal having a very low resistance being used as the gate electrode. In addition, the coefficient of thermal expansion of the refractory metal film is different from that of the gate insulation film.

Because of this phenomena, the gate insulation film is broken down, thereby causing leakage of electric current and short circuits between the gate electrode and the semiconductor substrate.

It is currently known to employ electrodes composed of two layers of silicide and polycrystalline silicon as the gate electrode for an MIS device. However, such a material is associated with a high electrical resistance, which presents serious problems, particularly when highly integrated circuits are to be produced. In order to reduce this resistance as much as possible, it is presently considered essential to employ refractory metal for electrodes. However, the electrode material employed must be compatible with silicon gate processes and refractory metals have been found to be a source of instabilities during manufacture and to impair long term stability of the resulting integrated circuits.

SUMMARY OF THE INVENTION

It is an object of the present invention to provide an MIS type semiconductor integrated circuit device which can employ a silicon gate process, which is protected against pollution by a resist film or organic solvents in case of using refractory metal as a gate electrode or contacts, exhibits no variation of a threshold voltage and provides a stable value of the threshold voltage, is highly resistant to chemicals such as acid, is able to withstand oxygen and moisture in an atmosphere during heat treatment, and has high reliability.

The above and other objects are achieved, according to the present invention, by an MIS type semiconductor integrated circuit device, comprising:

a semiconductor substrate of a first conductivity type provided with spaced source and drain regions of a second conductivity type;

a gate insulation film formed on the semiconductor substrate;

a film of polycrystalline silicon formed on the gate insulation film;

a gate electrode composed of a film of a refractory metal formed on the polycrystalline silicon film; and a film of a refractory metal silicide formed on the exposed surfaces of the gate electrode;

wherein the source and drain regions are formed in the semiconductor substrate on both sides of the gate electrode on which the refractory metal silicide film is formed.

Thus, the present invention eliminates problems previously encountered with refractory metal gate electrodes by covering the exposed surfaces, i.e., the top and the sides, of a refractory metal electrode with a refractory metal silicide film, thereby isolating the relatively unstable refractory metal from the external atmosphere to achieve passivation. In addition, according to the invention, a refractory oxide film of the refractory metal silicide is formed on the surface of the silicide, thereby achieving an improved passivation.

A structure according to the present invention is produced by forming refractory metal electrodes on the polycrystalline silicon film, and then processing the polycrystalline silicon film and the refractory metal to form the partially refractory metal silicide film. It thus becomes possible to prevent attack such as by penetration by the refractory metal through the gate oxide film.

Thus, according to the invention, after forming a field insulation film, a gate insulation film and a polycrystalline silicon layer, a refractory metal layer is formed on the silicon layer. Then, the refractory metal layer is partially removed to create the desired electrode and connecting pattern. Thereafter, refractory metal silicide is coated on the upper surface and both sides of the refractory metal electrode. Further, in case of need, the refractory metal silicide is thermally oxidized for forming an oxidized film and the refractory metal body, such as the gate electrode and the like, is covered by the stable refractory metal silicide and its oxidized film, thereby providing stability during subsequent heat treatment or acid treatment and promoting long term reliability.

Currently, there is a demand to advance MIS type semiconductor integrated circuit devices from LSI to VLSI. Developments are progressing toward megabit integration densities and submicron sizes based on transistor design rules.

There is a strong demand for MIS type semiconductor integrated circuit devices which are more highly integrated, operate at higher speeds and are more reliable. For satisfying these requirements, significant developments are being made in the technology of circuits and processing. One remarkable development in the field of processing is the refractory metal wiring technique expected to be applied in accordance with the progress in LSI.

When refractory metals such as Ti, W, Mo, Ta, Pt are applied for the wiring of the gate electrode, some structures such as a monolayer of the refractory metal film and lapped structure on polycrystalline silicon are considered. However, there are many problems involved in providing interchangeability with silicon gate process and using such structures of refractory metal widely. Therefore, these structures have not been put into practical use.

DESCRIPTION OF THE PREFERRED EMBODIMENTS

Figure 1:
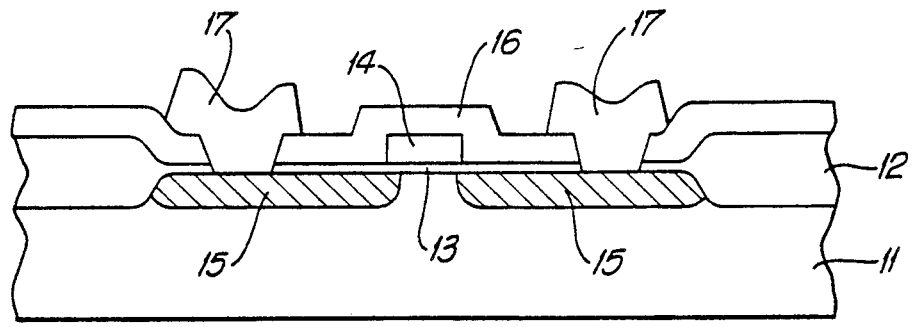
FIG. 1 is a sectional view of a conventional MIS type semiconductor integrated circuit device.

FIG. 2($d$) shows a finished device according to the present invention. This device is composed of an N-type monocrystalline silicon substrate 21, a field insulation film 22, a gate insulation film 23, a first polycrystalline silicon film 24, a refractory metal film 25 made, for example, of Ti, W, Mo, Ta, Pt or an alloy of such refractory metal such as TiW or TiMo, a refractory metal silicide film 27, P+ type source and drain regions 28, an oxidized film 29, an interlayer insulation film 30 composed of silicon oxide film or PSG (phosphorous silicate glass) film and so on, and source and drain contacts 31 made of aluminum, an Al-Si alloy or an Al-Si-Cu alloy, etc.

FIG. 2($a$) shows a first stage in the manufacture of a device according to the invention in which field insulation film 22 is deposited on N-type monocrystalline silicon substrate 21 to a thickness of 6000 to 10,000 Å by selective oxidation for 3 to 4 hours at 900° to 1000° C. in a moist oxygen atmosphere using a silicon nitride film and a silicon oxide film as the masking material on the surface regions where film 22 is not to be deposited.

The silicon nitride film and the silicon oxide film used as the masking agent at the time of selective oxidation are removed by etching using respectively phosphoric acid for 40 minutes and hydrofluoric acid.

Then, on an exposed portion of N-type monocrystalline silicon substrate 21, gate insulation film 23 with a thickness of 100 to 600 Å is formed by heat treatment in an atmosphere of moist oxygen at 900° to 1000° C. for 30 to 40 minutes. Then, on gate insulation film 23, the first polycrystalline silicon film 24 with a thickness of 500 to 2500 Å is formed by a treatment involving thermal decomposition of silane for 20 to 30 minutes in an atmosphere of $N_2$ gas. The first polycrystalline silicon film 24 is converted into N-type material by thermal diffusion from PoCl and $O_2$ gas. The first polycrystalline silicon film 24 may be converted into P-type by introducing Boron (B), if needed. Further, refractory metal film 25, of Ti, W, Mo, Ta and Pt or an alloy of such refractory metal such as TiW or TiMo, with a thickness of 2000 to 3000 Å and substantially coextensive with first polycrystalline silicon film 24 is formed on polycrystalline silicon film 24 by sputtering deposition. Undesired parts of refractory metal film 25 and first polycrystalline silicon film 24 are removed by photo etching, or plasma etching using an agent belonging to the halogen group, such as chlorine, or the freon group, and through plasma etching using an agent belonging to the freon group, respectively. Thus, the gate electrode and other connecting regions (not shown) are formed.

As shown in FIG. 2($b$), a second polycrystalline silicon film 26 having a thickness of 300 to 2000 Å is formed on the substrate containing refractory metal film 25 by thermal decomposition of silane in an atmosphere of $N_2$ gas at a temperature of 550° to 650° C. for 15 to 25 minutes, preventing refractory metal film 25 from being oxidized.

As shown in FIG. 2($c$), a portion or all of the second polycrystalline silicon film 26 in the region in contact with refractory metal film 25 and a portion of the first polycrystalline silicon film 24 in the portion in contact with refractory metal film 25 are converted into the refractory metal silicide film 27 by heat treatment in an atmosphere of inert gas such as nitrogen ($N_2$) or argon (Ar) at 900° to 1100° C. for 10 to 30 minutes. Subsequently, the portion of second polycrystalline silicon film 26 which had not been converted into refractory metal silicide film 27 and does not contact film 25 is removed by etching. Then P+ type source and drain regions 28 are formed by introducing Boron (B) ions by, for example, diffusion and ion implantation with an energy of 30 to 60 KeV. Then, in case of need, oxidized film 29 with a thickness of 100 to 1000 Å is formed on the surface of the refractory metal silicide film 27 by heat treatment of the whole substrate in an atmosphere of moist oxygen gas at 800° to 1000° C. for 20 to 40 minutes.

As shown in FIG. 2($d$), interlayer insulation film 30 composed of PSG or silicon oxide is formed by vapor phase growth deposition such as by a CVD method at 300° to 400° C. using monosilane and oxygen. Contact holes are then formed by partially removing interlayer insulation film 30 utilizing dry etching with an agent belonging to the Freon group by photo etching after annealing in an atmosphere of $N_2$ gas at a temperature from 800 to 1000° C. for activating source region and drain region 28. At each contact hole, contacts 31 of an Al-Si alloy or Al-Si-Cut alloy, having a thickness of 7000 to 10,000 Å are formed by a sputtering deposition method. Contacts 31 are then given the desired shape by removing undesired material by dry etching using an agent belonging to the halogen group.

Subsequently, though not shown, a passivation film is formed and is photo etched for forming a pad portion which is a connecting portion with leader wires. The MIS type semiconductor integrated circuit is formed by removing, through etching, the passivation film on which the pad portion is formed.

Figure 2A:
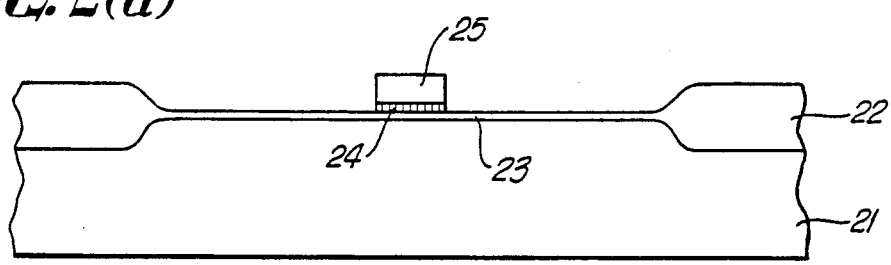
FIG. 2($a$), 2($b$), 2($c$) and 2($d$) are cross-sectional views illustrating successive stages in the fabrication of an MIS type semiconductor integrated circuit device according to an embodiment of the present invention.
Figure 2B:
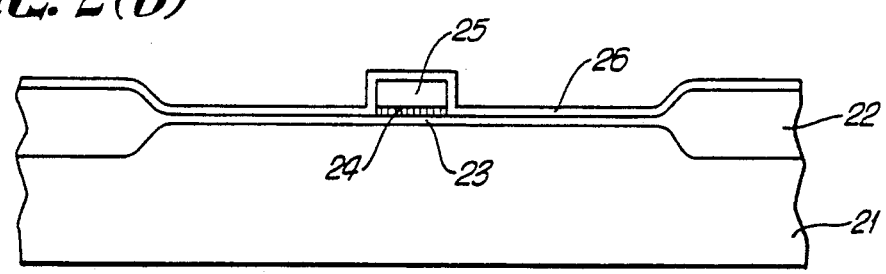

In the embodiment described above, the second polycrystalline silicon film 26, shown in FIG. 2(b), could be in the amorphous state rather than the polycrystalline state, if the forming temperature is relatively low close to a little under 500° to 600° C. It is considered that the first polycrystalline silicon film 24 has the same possibility.

Figure 2C:
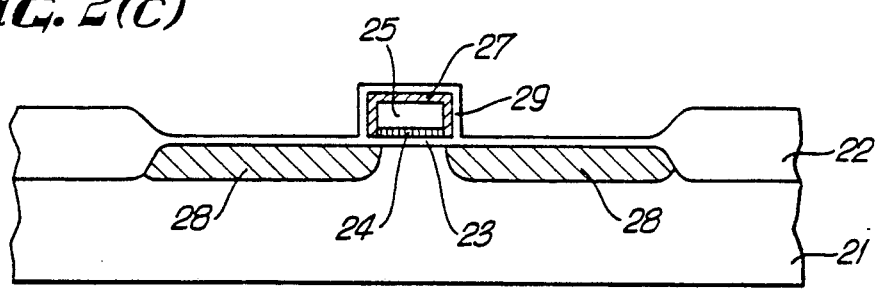
Figure 2D:
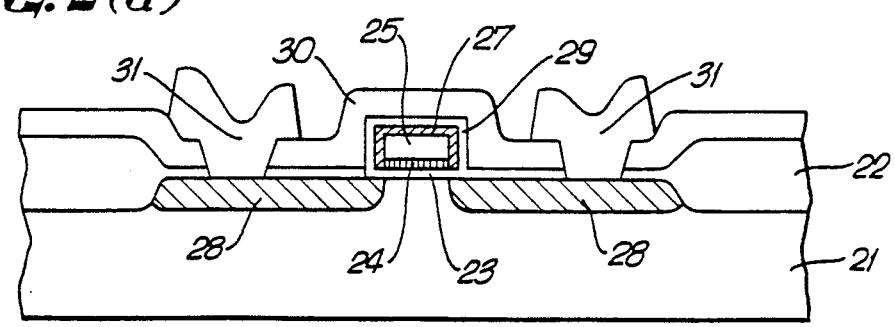

In the description of the construction of FIG. 2(c), it is described that a portion of the first polycrystalline silicon film 24 and a portion or all of the second polycrystalline silicon film 26 are converted into a refractory metal silicide film 27. It is not preferable that all of the first polycrystalline silicon film 24 be converted into the refractory metal silicide film 27. If all of the polycrystalline silicon film 24 is converted into refractory metal silicide film 27, undesirable phenomena, for example, the intrusion of metal through gate insulation film 23 from refractory metal film 25 to the substrate, and the breakdown of the gate insulation film 23 caused by differences between the thermal expansion coefficients of refractory metal film 25 and gate insulation film 23 will be potentially caused.

In the description of FIG. 2(c), the process of forming the refractory silicide film 27 and the process of forming source and drain regions 28 may be reversed, that is, if following the process of ion implantation with Boron (B) ion for forming source and drain regions 28, the process of forming the refractory metal silicide film 27 is provided, the heat treatment for forming refractory metal silicide film 27 can be used as the heat treatment for activating source and drain regions 28, simplifying the process.

Additionally, in the last part of the description of the construction of FIG. 2(c), it is described that oxidized film 29 having thickness of 100 to 1000 Å is formed on the surface of refractory metal silicide film 27. This oxidized film 29 can be formed by vapor phase growth deposition such as by a CVD method excepting forming by thermal oxidation. Further, oxidized film 29 need not be formed on the surface of refractory metal silicide film 27. In sort, oxidized film 29 should be formed as needed, for example according to the IC characteristics and reliability.

In the illustrated embodiment, an N-type monocrystalline silicon substrate 21 is used and Boron (B) is introduced into the substrate for forming source and drain regions 28. It is also possible for source and drain regions 28 to be formed by introducing Phosphorus (P) or Arsenic (As) into the substrate using P-type monocrystalline silicon substrate. The interlayer insulation film 30 can be single layer or multilayer.

In the illustrated embodiment, field insulation film 22 is described as being formed by selective oxidation. However, film 22 can be embedded in a groove formed in the substrate by anisotropic etching. These areas work at an element isolating region.

Further, the described semiconductor substrate can be a well region formed in a semiconductor substrate or a semiconductor region formed on an insulation substrate.

Thus, according to the present invention, a refractory metal film is used as the gate electrode, a refractory metal silicide film being formed on the side and top of the gate electrode, and a polycrystalline silicon film lies between the gate electrode and the gate insulation film. Therefore, the present invention produces the following results.

The polycrystalline silicon film lies between the refractory metal film gate electrode and the gate insulation film, and a portion of the side in contact with the refractory metal of the polycrystalline silicon layer is the refractory metal silicide film, thereby preventing breakdown of the gate insulation film in the present invention. Further, this provides an improved MIS type semiconductor integrated circuit device with very high reliability and superior characteristics.

As the present invention employs the construction described above, the sides and the top of the refractory metal electrode and contacts are coated with the stable refractory metal silicide film and, in case of need, the oxidized film is provided on the stable refractory metal silicide film by heat treatment or a CVD method and so on. Therefore, the semiconductor device according to the present invention is protected against pollution by the resist film or organic solvents, and is stable without a variation of the threshold voltage, being hardly attacked by chemicals such as acid. Furthermore, the semiconductor device of the present invention is never attacked even if there exist oxygen gas and moisture in the heat treatment atmosphere, because the surface of the refractory metal electrode and contacts of the semiconductor device of the present invention are covered with stable oxidized film, for example $SiO_2$ film.

Accordingly, the present invention provides an improved MIS type semiconductor integrated circuit device with high reliability, high quality, and high speed even if elements are microminiaturized.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An MIS type semiconductor integrated circuit device, comprising:
   a semiconductor substrate of a first conductivity type provided with spaced source and drain regions of a second conductivity type;
   a gate insulation film formed on said semiconductor substrate;
   a film of polycrystalline silicon formed on said gate insulation film;
   a gate electrode composed of a film of a refractory metal formed on said polycrystalline silicon film, said gate electrode having an exposed upper surface and exposed side surfaces; and a film of a refractory metal silicide formed on the exposed upper and side surfaces of said gate electrode;

wherein said source and drain regions are formed in said semiconductor substrate on both sides of said gate electrode on which said refractory metal silicide film is formed.

2. A device as claimed in claim 1 wherein a boundary surface exists between said refractory metal film and said polycrystalline film, and further comprising a refractory metal silicide film on the boundary surface between said refractory metal film and said polycrystalline silicon film.

3. A device as claimed in claim 2 wherein said refractory metal silicide film has a surface, and further comprising an oxidized film coating on the surface of said refractory metal silicide film formed on the exposed surfaces of said gate electrode.

4. A device as claimed in claim 3 wherein said oxidized film coating is composed of a thermally produced oxide of said refractory metal silicide film.

5. A device as claimed in claim 4 wherein said refractory metal silicide film is composed of a thermally produced silicide of said refractory metal.

6. A device as claimed in claim 5 wherein the thickness of said polycrystalline silicon film is about 500 to 2500 Å.

7. A device as claimed in claim 6 wherein said refractory metal is a metal selected from Ti, W, Mo, Ta and Pt.

8. A device as claimed in claim 5 wherein said refractory metal is a metal selected from Ti, W, Mo, Ta and Pt.

9. A device as claimed in claim 4 wherein said refractory metal is a metal selected from Ti, W, Mo, Ta and Pt.

10. A device as claimed in claim 3 wherein said refractory metal is a metal selected from Ti, W, Mo, Ta and Pt.

11. A device as claimed in claim 2 wherein said refractory metal is a metal selected from Ti, W, Mo, Ta and Pt.

12. A device as claimed in claim 2 wherein said refractory metal silicide film is composed of a thermally produced silicide of said refractory metal.

13. A device as claimed in claim 12 wherein the thickness of said polycrystalline silicon film is about 500 to 2500 Å.

14. A device as claimed in claim 1 wherein said refractory metal silicide film is composed of a thermally produced silicide of said refractory metal.

15. A device as claimed in claim 1 wherein the thickness of said polycrystalline silicon film is about 500 to 2500 Å.

16. A device as claimed in claim 1 wherein said refractory metal silicide film has a surface, and further comprising an oxidized film coating on the surface of said refractory metal silicide film formed on the exposed surfaces of said gate electrode.

17. A device as claimed in claim 16 wherein said oxidized film coating is composed of a thermally produced oxide of said refractory metal silicide film.

18. A device as claimed in claim 17 wherein said refractory metal silicide film is composed of a thermally produced silicide of said refractory metal.

19. A device as claimed in claim 18 wherein the thickness of said polycrystalline silicon film is about 500 to 2500 Å.

20. A device as claimed in claim 19 wherein said refractory metal is a metal selected from Ti, W, Mo, Ta and Pt.

21. A device as claimed in claim 6 wherein said refractory metal is an alloy of a metal selected from Ti, W, Mo, Ta and Pt.

22. A device as claimed in claim 21 wherein said refractory metal is TiW.

23. A device as claimed in claim 21 wherein said refractory metal is TiMo.

* * * * *